(12) United States Patent
Pawlak

(10) Patent No.: US 7,326,620 B2
(45) Date of Patent: Feb. 5, 2008

(54) METHOD OF MANUFACTURING A SEMICONDUCTOR DEVICE AND SEMICONDUCTOR DEVICE OBTAINABLE WITH SUCH A METHOD

(75) Inventor: Bartlomiej Jan Pawlak, Leuven (BE)

(73) Assignees: Interuniversitair Microelektronica Centrum (IMEC), Leuven (BE); Koninklijke Philips Electronics, Eindhoven (NL)

( * ) Notice: Subject to any disclaimer, the term of this patent is extended or adjusted under 35 U.S.C. 154(b) by 65 days.

(21) Appl. No.: 11/077,973

(22) Filed: Mar. 11, 2005

(65) Prior Publication Data

US 2005/0236663 A1 Oct. 27, 2005

(30) Foreign Application Priority Data

Mar. 12, 2004 (EP) .................... 04101013

(51) Int. Cl.
H01L 21/336 (2006.01)

(52) U.S. Cl. ............... 438/283; 438/589; 257/E21.442

(58) Field of Classification Search ............. 438/238, 438/582, 283; 257/E21.442
See application file for complete search history.

(56) References Cited

U.S. PATENT DOCUMENTS

| | | | | |
|---|---|---|---|---|
| 5,828,101 | A * | 10/1998 | Endo ................ | 257/330 |
| 5,872,037 | A * | 2/1999 | Iwamatsu et al. ......... | 438/268 |
| 6,033,959 | A * | 3/2000 | Fu ..................... | 438/289 |
| 6,097,061 | A | 8/2000 | Liu et al. ............. | 257/330 |
| 6,225,659 | B1 | 5/2001 | Liu .................... | 257/314 |
| 6,448,590 | B1 * | 9/2002 | Adkisson et al. ......... | 257/202 |
| 6,548,859 | B2 * | 4/2003 | Maegawa ............... | 257/327 |
| 6,580,137 | B2 | 6/2003 | Parke .................. | 257/401 |
| 7,015,106 | B2 * | 3/2006 | Yoon et al. ............ | 438/283 |
| 2002/0197874 | A1 | 12/2002 | Divakaruni et al. ...... | 438/700 |

* cited by examiner

*Primary Examiner*—Trung Dang
(74) *Attorney, Agent, or Firm*—McDonnell Boehnen Hulbert & Berghoff LLP

(57) ABSTRACT

A method of manufacturing a semiconductor device comprising a dual gate field effect transistor is disclosed, in which method a semiconductor body with a surface and of silicon is provided with a source region and a drain region of a first conductivity type and with a channel region of a second conductivity type, opposite to the first conductivity type, between the source region and the drain region and with a first gate region separated from the channel region by a first gate dielectric and situated on one side of the channel region and with a second gate region separated from the channel region by a second gate dielectric and situated on an opposite side of the channel region, and wherein both gate regions are formed within a trench formed in the semiconductor body.

13 Claims, 3 Drawing Sheets

METHOD OF MANUFACTURING A SEMICONDUCTOR DEVICE AND SEMICONDUCTOR DEVICE OBTAINABLE WITH SUCH A METHOD

BACKGROUND OF THE INVENTION

1. Field of the Invention

The invention relates to a method of manufacturing a semiconductor device comprising a dual gate field effect transistor.

2. Description of the Related Technology

A method of manufacturing a semiconductor device comprising a dual gate field effect transistor is known from U.S. Pat. No. 6,580,137 B2 that has been issued on Jun. 17, 2003. Therein (see e.g. FIG. 12B and the description columns 7 to 14) a method is described in a dual gate transistor is provided in a trench. One of the gate regions is formed at the bottom part of the trench while the other gate region is formed in the upper part of the trench, the channel region being interposed between the two gate regions.

A drawback of the known method is that it is rather complicated and requires relatively many steps. Thus, there is still the need for a method for forming a dual gate transistor which can be easily incorporated in present and future CMOS technology.

SUMMARY OF CERTAIN INVENTIVE EMBODIMENTS

The invention relates to a method of manufacturing a semiconductor device comprising a dual gate field effect transistor, in which method a semiconductor body with a surface and of silicon is provided with a source region and a drain region of a first conductivity type and with a channel region of a second conductivity type, opposite to the first conductivity type, between the source region and the drain region and with a first gate region separated from the channel region by a first gate dielectric and situated on one side of the channel region and with a second gate region separated from the channel region by a second gate dielectric and situated on an opposite side of the channel region and wherein both gate regions are formed within a trench formed in the semiconductor body.

DETAILED DESCRIPTION OF CERTAIN INVENTIVE EMBODIMENTS

Figure 1:
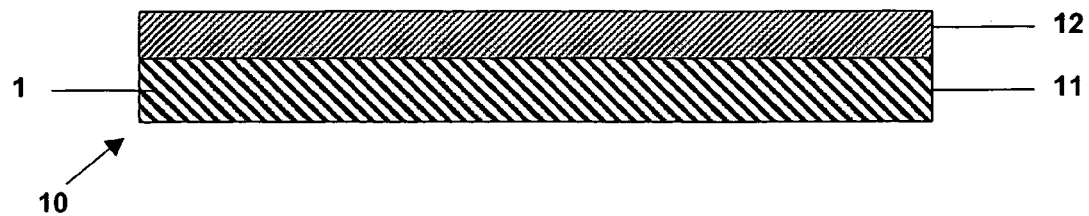
FIGS. 1 through 5 are sectional views and FIGS. 6-8 are top views of a semiconductor device with a dual gate field effect transistor according to the invention at various stages in the manufacture of the device by means of a method in accordance with the invention.

The invention relates to a method of manufacturing a semiconductor device comprising a dual gate field effect transistor, in which method a semiconductor body with a surface and of silicon is provided with a source region and a drain region of a first conductivity type and with a channel region of a second conductivity type, opposite to the first conductivity type, between the source region and the drain region and with a first gate region separated from the channel region by a first gate dielectric and situated on one side of the channel region and with a second gate region separated from the channel region by a second gate dielectric and situated on an opposite side of the channel region and wherein both gate regions are formed within a trench formed in the semiconductor body. The use of a double gate structure can generally be used to reduce leakage current when the transistor is off and increases drive current when the transistor is on. These aspects become increasingly important as demands on further miniaturization, lower power use and better high-frequency behavior in CMOS devices are still relevant. The invention relates to a semiconductor device of the above construction.

It is therefore an object of the present invention to avoid the above drawbacks and to provide a method for manufacturing a dual gate transistor which is relatively simple and is very well compatible with present and future CMOS technology.

To achieve this, a method of the type described in the opening paragraph is characterized in that the first gate region is formed within a first trench and the second gate region is formed within a second trench, the channel region is formed by the part of the semiconductor body between the first and second trench and the source and drain regions are formed at the surface of the semiconductor body. Such a method is relatively simple and is very well compatible with present and most likely with future CMOS technology. The dual gate transistor formed is on the one hand vertical since the channel in the channel region is formed in a plane perpendicular to the surface of the semiconductor body and on the other hand horizontal since the source and drain regions are formed at the surface of the semiconductor body in a conventional manner. The dual gates that are present in two adjacent trenches offer a more efficient control over the channel.

In a preferred embodiment of a method according to the invention two parallel trenches are formed in the surface of the semiconductor body of which the walls are provided with a dielectric layer and which are filled with a conductive material by depositing a conductive layer on the semiconductor body of which the parts on top of the surface of the semiconductor body are removed by chemical mechanical polishing. Such a method is very well compatible with standard CMOS technology. The conductive material is preferable a metal. Alternatively the conductive material can be formed in two stages. E.g. by depositing a silicon layer and by depositing a metal layer, for example a nickel layer, on top of the silicon layer followed by a low temperature anneal, e.g. a few minutes at 300 degrees Celsius, in which a nickel silicide is formed offering a high conduction.

In a further embodiment the source and drain regions are formed by depositing a strip-shaped mask layer on the surface of the semiconductor body which bridges the two regions were the trenches are formed or to be formed after which dopants of the first conductivity type are introduced into the semiconductor body on both sides of the strip-shaped mask layer. Preferably the source and drain regions are formed after the trenches are formed and filled with the conductive material/metal. Ion implantation is a very suitable technique to form source and drain regions in a method according to the invention. A low temperature so-called SPE (=Solid Phase Epitaxy) regrowth process may be used to allow for a low thermal budget. In a manufacturing process using high temperature activation of junctions, the channel and source and drain can be formed before the trenches are created.

In another preferred embodiment two dual gate transistors are formed in the semiconductor body and next to each other by forming three trenches in the semiconductor body of which the middle one forms a common gate for both two dual gate transistors. In this way, e.g. an inverter is formed in a simple manner which is also very compact. This requires that one of the two dual gate transistors is formed as an npn transistor while the other one is formed as a pnp transistor. The latter is easily obtainable in a method according to the invention as both the source and drain regions are formed at the surface of the semiconductor body. Also the channel region of one of the two transistors may be provided with another—is opposite—conductivity type by a local implantation at the surface of the semiconductor body.

Preferably the source and drain regions of the dual gate transistor(s) are separated from the semiconductor body on a side opposite to the channel region(s) by further trenches.

The invention further relates to a semiconductor device comprising a dual gate field effect transistor, having a semiconductor body with a surface and of silicon and with a source region and a drain region of a first conductivity type and with a channel region of a second conductivity type, opposite to the first conductivity type, between the source region and the drain region and with a first gate region separated from the channel region by a first gate dielectric and situated on one side of the channel region and with a second gate region separated from the channel region by a second gate dielectric and situated on an opposite side of the channel region, and wherein both gate regions are formed within a trench formed in the semiconductor body. According to the invention such a device is characterized in that the first gate region is formed within a first trench and the second gate region is formed within a second trench, the channel region is formed by the part of the semiconductor body between the first and second trench and the source and drain regions are formed at the surface of the semiconductor body.

Such a device is very suitable for use in future CMOS ICs and may easily be obtained using a method according to the invention. Preferably such a device comprises two neighboring dual gate transistors having one gate in common.

Figure 2:
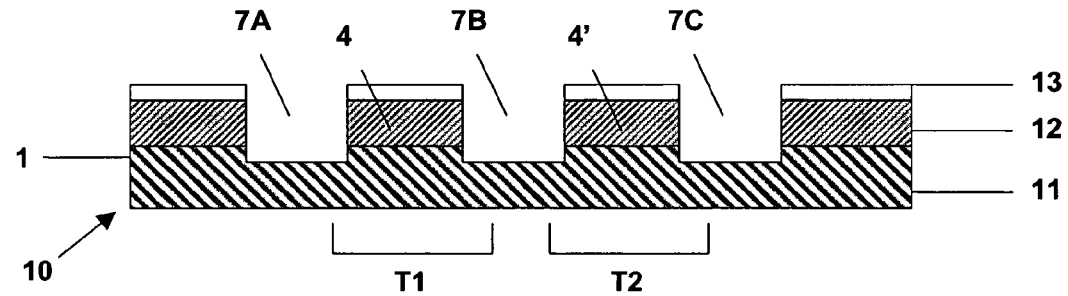
Figure 3:
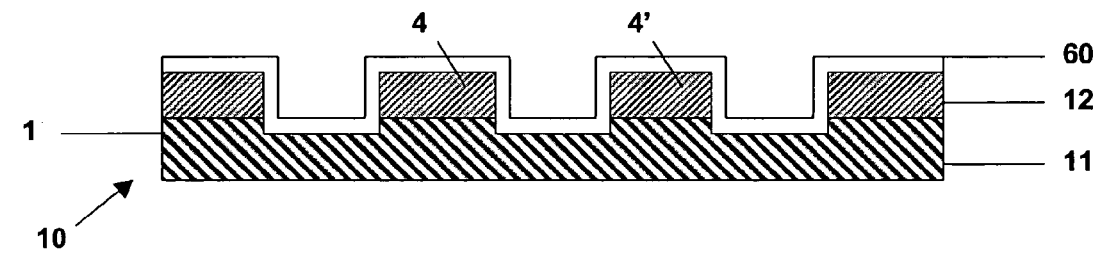
Figure 4:
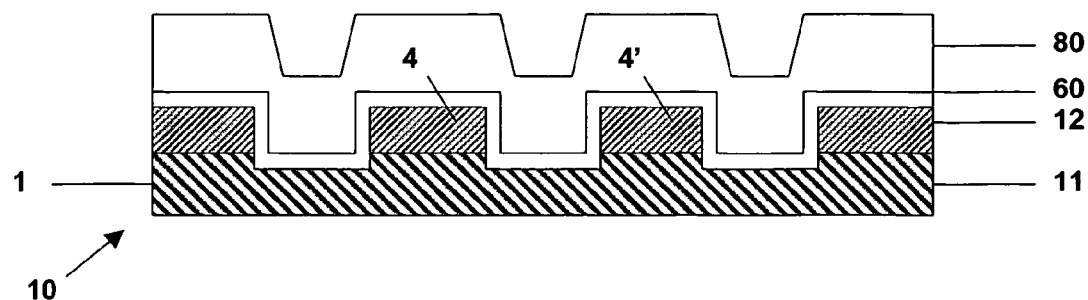
Figure 5:
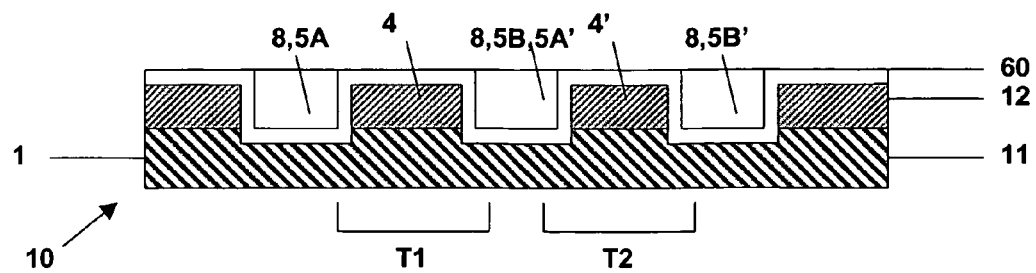
Figure 6:
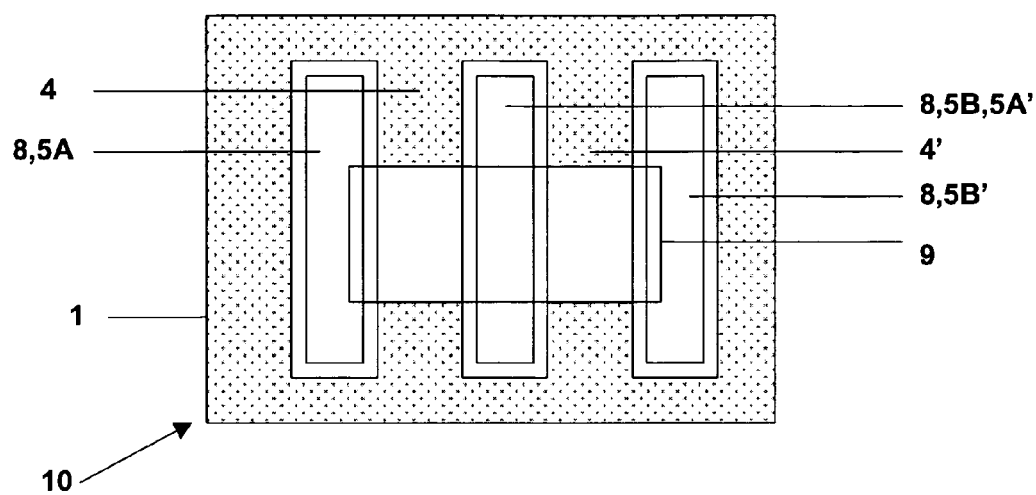
Figure 7:
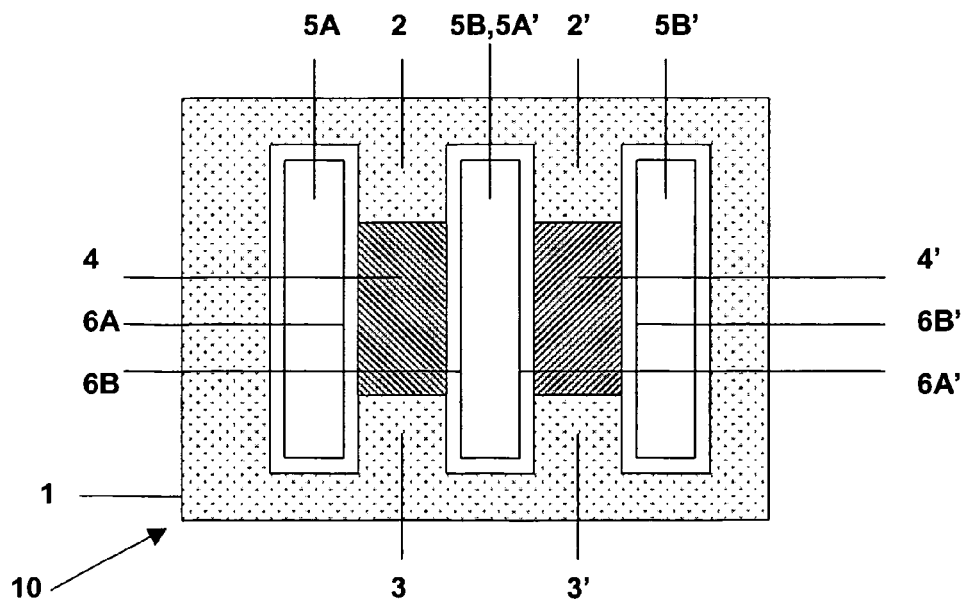
Figure 8:
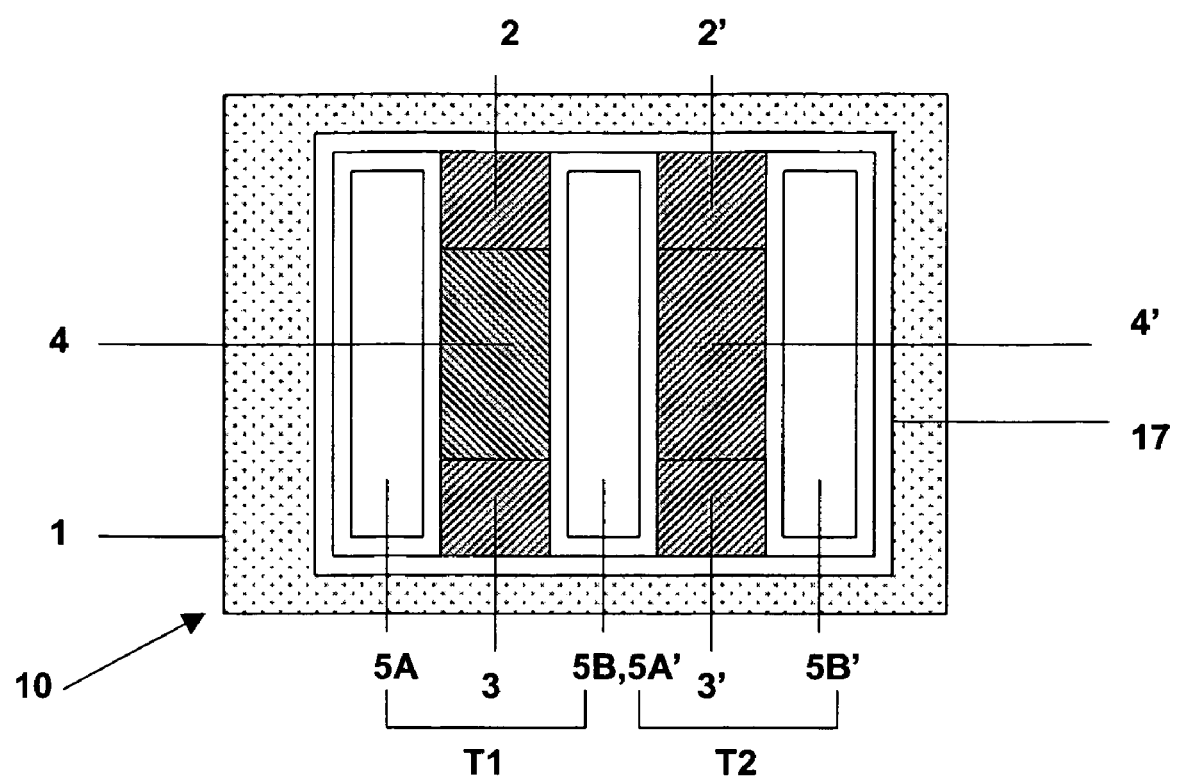

These and other aspects of the invention will be apparent from and elucidated with reference to the embodiments described hereinafter, to be read in conjunction with the drawing, in which FIGS. 1 through 8 are sectional (FIGS. 1-5) or top (FIGS. 6-8) views of a semiconductor device with a dual gate field effect transistor according to the invention at various stages in the manufacture of the device by means of a method in accordance with the invention.

The figures are diagrammatic and not drawn to scale, the dimensions in the thickness direction being particularly exaggerated for greater clarity. Corresponding parts are generally given the same reference numerals and the same hatching in the various figures.

FIGS. 1 through 8 are sectional (FIGS. 1-5) or top (FIGS. 6-8) views of a semiconductor device with a dual gate field effect transistor according to the invention at various stages in the manufacture of the device by means of a method in accordance with the invention. The method for forming the device 10 starts (see FIG. 1) in this example with a substrate 11 which in this case, but not necessarily, comprises silicon and thus also forms part of the semiconductor body 1 of silicon and which in this example is of the p-type conductivity. It is to be noted here that the substrate 11 also can have the opposite conductivity type. Moreover, the region 11 may also be e.g. an n-well (or p-well for that matter) within a silicon substrate of the opposite conductivity type, e.g. p-type and n-type respectively. Furthermore, in this case the substrate/region 11 comprises the channel region 4 of the transistor to be formed in the form of an opposite conductivity type layer 12, here of the n-type. This layer may be formed by implantation, diffusion or epitaxy. The device 10 to be formed, which is in this case comprises a (dual gate) NMOST, contains in practice near its borders isolation regions 12 such as a so-called trench or LOCOS (=Local Oxidation of Silicon) isolation, the former being preferred in an advanced technology node. In practice the device 10 often will be an IC (=Integrated Circuit) and thus contains many transistors. In a CMOS device 10 transistors of both of the NMOS and PMOS type will be present.

At the surface of the semiconductor body 1 (see FIG. 2) a mask 13 is deposited on the semiconductor body 1 which is formed by photolithography if desired after deposition of a dielectric material which then comprises a photoresist or a dielectric respectively. The mask 13 is used to form in this example three trenches 7A,7B,7C by means of anisotropic (plasma) etching. The regions 4,4' of the semiconductor body 1 between each pair of neighboring trenches 7 will form the channel regions of two dual gate transistors T1,T2 to be formed. The depth of the trenches 7 is such that the pn-junction between regions 11,12 is crossed.

After removal of the mask 13 (see FIG. 3) an dielectric layer 60 is deposited on the semiconductor body 1, e.g. comprising silicondioxide. Layer 60 may be formed by CVD (=Chemical Vapor Deposition) but also a thermal oxidation is suitable for that purpose.

Subsequently (see FIG. 4) a conducting layer 80, in this case a metal layer 80 which comprises in this example wolfram, is deposited on the semiconductor body 1. The thickness of layer 80 is chosen such that the trenches 7 are completely filled. The layer 80 may be formed by CVD or by physical techniques like evaporation or sputtering.

Next (see FIG. 5) the semiconductor body 1 is planarized by chemical-mechanical polishing such that the regions of the metal layer 80 outside the trenches 7 are removed. The remaining parts of this layer 80 form the material 8 of four gate regions (5A,5B),(5A',5B') of the two transistors T1,T2 to be formed, wherein the gate regions 5B and 5A' form a common gate region for both transistors.

Thereafter (see FIG. 6 which shows a top view of the device 10) a mask 9, e.g. of silicondioxide or siliconnitride, is formed on top of the semiconductor body 1. The mask 9 is strip-shaped, has a small width and bridges the two channel regions 4,4' of the two transistors to be formed.

Subsequently (see FIG. 7) dopant of a conductivity type opposite to that of the channel regions 4,4', in this case p-type impurities like Boron, are introduced in the semiconductor body 1, here by means of ion implantation. In this way source and drain regions 2,3,2',3' of the two transistors are formed. After the implantation (and annealing thereof) the mask 9 is removed again. In a case where the two dual gate transistors T1,T2 are required to be of opposite structure, implying that one of the two is of the npn-type and the other of the pnp-type, an additional implantation is used to create the channel region of one of the two transistors. Also source and drain formation is done in separate steps during which one of the two transistors is masked Next (see FIG. 8) in this example a further trench 17 is formed around the two transistors T1,T2. This is done in a similar way as for the trenches 7. The further trench 17 may be partly or completely filled with an electrically insulating material, e.g. in the same way as described before for the trenches 7.

Finally the manufacturing of the n-MOSFET is completed by deposition of a pre-metal dielectric, e.g. of silicondioxide, followed by patterning thereof, deposition of a contact metal layer, e.g. of aluminum, again followed by patterning by which contact regions are formed. These steps are not shown in the drawing. A (self-aligned) silicide process may further be used to contact the source- and drain regions 2,3 and the gate region 5 in case the latter comprises e.g. polysilicon as the conducting material 8.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a semiconductor device comprising a dual gate field effect transistor, comprising:
   providing a semiconductor body of silicon with a surface, a source region and a drain region of a first conductivity type, a channel region of a second conductivity type, opposite to the first conductivity type, between the source region and the drain region;
   forming a first gate within a first trench, separated from the channel region by a first gate dielectric and situated on one side of the channel region;
   forming a second gate within a second trench, separated from the channel region by a second gate dielectric and situated on an opposite side of the channel region,
   wherein both gates are formed within a third trench formed in the semiconductor body,
   wherein the channel region is formed by the part of the semiconductor body between the first and second trench, and
   wherein the source and drain regions are formed by implantation at the surface of the semiconductor body.

2. A method of manufacturing a semiconductor device comprising a dual gate field effect transistor, comprising:
   providing a semiconductor body of silicon with a surface, a source region and a drain region of a first conductivity type, a channel region of a second conductivity type, opposite to the first conductivity type, between the source region and the drain region;
   forming a first gate within a first trench, separated from the channel region by a first gate dielectric and situated on one side of the channel region;
   forming a second gate within a second trench, separated from the channel region by a second gate dielectric and situated on an opposite side of the channel region,
   wherein both gates are formed within a third trench formed in the semiconductor body,
   wherein the channel region is formed by the part of the semiconductor body between the first and second trench, and
   wherein the first and second trenches are formed in parallel in the surface of the semiconductor body and trench walls are provided with a dielectric layer and are filled with a conductive material by depositing a conductive layer on the semiconductor body, and wherein selected portions on top of the surface of the semiconductor body are removed by chemical mechanical polishing.

3. The method as claimed in claim 1, wherein the source and drain regions are formed by depositing a strip-shaped mask layer on the surface of the semiconductor body which bridges the two regions where the trenches are formed or to be formed, after which dopants of the first conductivity type are introduced into the semiconductor body on both sides of the strip-shaped mask layer.

4. The method as claimed in claim 1, further comprising forming two dual gate transistors which are proximate each other in the semiconductor body by forming a fourth trench in the semiconductor body of which the second trench forms a common gate for the two dual gate transistors.

5. The method as claimed in claim 4, wherein a first of the two dual gate transistors is formed as an npn transistor and a second of the two dual gate transistors is formed as a pnp transistor.

6. The method as claimed in claim 1, wherein the source and drain regions of the dual gate transistor are separated from the semiconductor body on a side opposite to the channel region by the third trench.

7. The method as claimed in claim 1, wherein the dual gate transistor is formed together with other conventional transistors made by conventional CMOS technology.

8. The method as claimed in claim 2, wherein the conductive layer comprises metal.

9. A method of manufacturing a semiconductor device comprising a dual gate field effect transistor, comprising:
   providing a semiconductor body of silicon with a surface, a source region and a drain region of a first conductivity type, a channel region of a second conductivity type, opposite to the first conductivity type, between the source region and the drain region;
   forming a first gate within a first trench, separated from the channel region by a first gate dielectric and situated on one side of the channel region;
   forming a second gate within a second trench, separated from the channel region by a second gate dielectric and situated on an opposite side of the channel region,
   wherein the first and second trenches are formed in parallel in the surface of the semiconductor body and trench walls are provided with a dielectric layer and are filled with a conductive material by depositing a conductive layer on the semiconductor body, and wherein selected portions on top of the surface of the semiconductor body are removed;
   wherein the first and second gates are formed within a third trench formed in the semiconductor body,
   wherein the channel region is formed by the part of the semiconductor body between the first and second trench, and
   wherein the source and drain regions are formed by implantation at the surface of the semiconductor body.

10. The method of claim 9, wherein the selected portions on top of the surface of the semiconductor body are removed by chemical mechanical polishing.

11. A method of manufacturing a semiconductor device comprising a dual gate field effect transistor, comprising:
   providing a semiconductor body;
   forming a source region and a drain region of a first conductivity type in the semiconductor body, wherein the source region and the drain region are formed by implantation at opposite sides along a length of the semiconductor body;
   forming a channel region of a second conductivity type, opposite to the first conductivity type, between the source region and the drain region;
   forming a first gate within a first trench, separated from the channel region by a first gate dielectric and situated on one side of the channel region;
   forming a second gate within a second trench, separated from the channel region by a second gate dielectric and situated on an opposite side of the channel region, wherein the second gate is separated from the first gate, wherein the first and second gates are formed within a third trench formed in the semiconductor body, and wherein the channel region is formed by the part of the semiconductor body between the first and second trenches.

12. The method of claim 11, wherein the first and second trenches are formed in parallel in the semiconductor body and trench walls are provided with a dielectric layer and are filled with a conductive material by depositing a conductive layer on the semiconductor body, and wherein selected portions on top of the semiconductor body are removed.

13. The method of claim 12, wherein the selected portions on top of the semiconductor body are removed by chemical mechanical polishing.

* * * * *